United States Patent
Thiel et al.

(10) Patent No.: US 8,986,563 B2
(45) Date of Patent: Mar. 24, 2015

(54) METHOD FOR THE PRODUCTION OF THREE-DIMENSIONAL MICROSTRUCTURES

(75) Inventors: Michael Thiel, Karlsruhe (DE); Martin Hermatschweiler, Karlsruhe (DE)

(73) Assignee: Nanoscribe GmbH, Eggenstein-Leopoldshafen (DE)

( * ) Notice: Subject to any disclaimer, the term of this patent is extended or adjusted under 35 U.S.C. 154(b) by 190 days.

(21) Appl. No.: 13/530,569

(22) Filed: Jun. 22, 2012

(65) Prior Publication Data

US 2012/0325775 A1    Dec. 27, 2012

(30) Foreign Application Priority Data

Jun. 22, 2011   (DE) .......................... 10 2011 105 679

(51) Int. Cl.
    *C03C 15/00*      (2006.01)
    *B81C 1/00*      (2006.01)

(52) U.S. Cl.
    CPC ..... *B81C 1/00373* (2013.01); *B81B 2203/0392* (2013.01); *B81B 2207/07* (2013.01); *B81C 2201/0187* (2013.01)
    USPC .......................................................... 216/52

(58) Field of Classification Search
None
See application file for complete search history.

(56) References Cited

U.S. PATENT DOCUMENTS 7,928,004 B2   4/2011   Seidel et al.
8,465,910 B2 *   6/2013   Singer et al. .................. 430/325
2008/0105355 A1 *   5/2008   Kumar et al. .................. 156/60
2009/0194425 A1 *   8/2009   Cohen et al. .................. 205/123
2010/0117268 A1 *   5/2010   Hattori .......................... 264/447
2010/0196660 A1   8/2010   Dressler
2010/0219156 A1   9/2010   Hipwell et al.

FOREIGN PATENT DOCUMENTS

DE      697 07 634      10/2001
DE      10 2006 030 267      4/2009
DE      10 2009 000 642      9/2010

OTHER PUBLICATIONS

Saile et al., "Advanced Micro & Nanosystems, LIGA and its Applications", vol. 7, 1st edition, Wiley-VCH, 2009.
Schnitker, Mark, "Stereolithographie—das bekannteste Verhafren des Rapid Prototyping", http://www.grin.com, Document No. V146092.
Maruo, Shoji, "Three-Dimension Microfabrication with Two-Photo-Absorbed Photopolymerization", Optics Letters, vol. 22, No. 2, Jan. 15, 1997, pp. 132-134.

* cited by examiner

*Primary Examiner* — Duy Deo
*Assistant Examiner* — Bradford Gates
(74) *Attorney, Agent, or Firm* — Volpe and Koenig, P.C.

(57) ABSTRACT

A method for producing three-dimensional microstructures in which a source material is applied on a substrate, with a property changing by exposure with electromagnetic radiation. A three-dimensional source structure is written via spatially-resolving exposure in the source material, the source material is removed except for the source structure, and the source structure is molded with a target material, from which the microstructure to be produced is made. Here, a shell structure is provided surrounding the microstructure to be produced, with the source structure being created as the shell structure or the shell structure is produced using the source structure, and subsequently the target material is inserted into the shell structure.

13 Claims, 6 Drawing Sheets

METHOD FOR THE PRODUCTION OF THREE-DIMENSIONAL MICROSTRUCTURES

CROSS-REFERENCE TO RELATED APPLICATIONS

This application claims the benefit of German Patent Application No. DE 10 2011 105 679.7, filed Jun. 22, 2011, which is incorporated herein by reference as if fully set forth.

BACKGROUND

The invention relates to a method for the production of three-dimensional microstructures.

In a method of the present type first a source material is applied on a substrate, with here the properties of the source material can be changed by exposure to electromagnetic radiation. In lithographic methods of prior art such source materials are provided as positive or negative resists, for example. Then, using locally resolved exposure of the source material a three-dimensional source structure is written, either by a sequential layer-for-layer method or in a single step. Depending on the source material used (for example positive or negative resist) the source structure is removed from the source material or the source material is removed except for a source structure. Subsequently the source structure is molded from a target material, which the microstructure to be produced is to be made from. Conventional target materials are particular metals, metal alloys, semiconductors, and ceramics.

Microstructures in the sense of the present invention are such structures that extend perpendicular in reference to a substrate and exhibit an extension ranging from more than approx. 0.1 µm to approximately 1 mm. In the sense of the present invention microstructures are called "three-dimensional" which in a top view of the substrate exhibit undercuts inwardly or outwardly, with here a spatial periodicity not being required.

In prior art microstructures are usually molded via a matrix produced from a positive resist. The exposure of positive resists leads to a chemical or physical change at the exposed site. This change may develop for example by the disintegration of chemical bonds. In order to allow the production of three-dimensional structures the light source is focused in the positive resist, namely such that the chemical bonds of the resist are only disintegrated in the focus. This can be achieved by a non-linear effect, i.e. either the resist reacts non-linear and shows a limit of light intensity, below which no exposure may occur, or the method of the two- or multi-photon polymerization is used, i.e. the probability for exposure in the focus is increased by the intensity increased here in reference to the environment. The disintegration of chemical bonds in the positive resist leads to a selective solubility thereof in the subsequent development step. Only the exposed areas are washed out.

A respective method is known for example from the publication Gansel, Thiel, Rill, Decker, Bade, Saile, von Freymann, Linden, Wegener: Gold Helix Photonic Metamatertial as Broadband Circular Polarizer, Science, Volume 325, 1513 (September 2009). Here, three-dimensional microstructures are produced from gold such that positive resists are exposed and developed by a direct laser writing method based on a multi-photon absorption mechanism. By the exposure and/or the writing of a source structure hollow spaces develop during the development at those locations of the positive resist to which the laser had been focused. Subsequently, an electrolyte gold is galvanically precipitated into these hollow spaces.

Based on the properties of the positive resist this method of prior art is however subject to limitations: positive resists are generally unable to form well-defined structures with a height of more than a few 10 µm, because the resist itself cannot be applied with a thickness of more than a few 10 µm without the quality of the source structure being considerably compromised. Although it can be multiplied by repeated applications, this however increases the complexity with reduced quality of the source structure. Further, positive resists show the characteristic of offering relatively low resolution for optic lithography processes (particularly in three-dimensional exposure), so that structures finer than approximately 500 nm cannot be produced with the quality required.

Although negative resists are not subject to the above-mentioned limitations of the positive resists, however here the entire volume of the resists must be exposed, except for the areas, which later shall be separated as the target material. The increase in exposure period involved here is acceptable at best at laboratory scales. Alternatively, several methods can be used simultaneously or sequentially in order to minimize the writing time, for example by template exposure of large resist volumes on the substrate, however in this case complexity increases.

Additional examples for methods to produce three-dimensional microstructures, which however are not directly equivalent to the method of the present type, are disclosed in the publication "LIGA and its applications", in Advanced Micro & Nanosystems, Volume 7, $1^{st}$ edition, Wiley-VCH, 2009, and in the publication "Stereolithographie—das bekannteste Verfahren des Rapid Prototyping (Stereolighography—the best-known method for rapid prototyping)", Volume V146092, Grin Verlag, 2010. In the first-mentioned publications of prior art, two and three-dimensional structures are produced by exposing resists, galvanic precipitation, and micro-molding. For this purpose, photo-templates are used, which are placed onto the resists. This way, high-aspect 2D-structures can be produced; by a targeted exposure from various angles and repeated exposure even more complex 3D-structures can be realized. In the second publication mentioned regarding prior art a stereo-lithographic method is described by which microstructures can be produced as well. Here, in a bath filled with the basic monomers of a light-sensitive plastic, thin plastic layers are cured by a laser. After each curing step the work piece is lowered a few millimeters into the liquid and returned to a position located lower by the amount of a layer thickness. This way, a three-dimensional structure is generated layer by layer.

SUMMARY

The objective of the present invention, based on the above-described prior art, is to allow the production of three-dimensional microstructures in a method of the type mentioned at the outset with faster and/or with greater precision than previously possible and/or with greater height.

This objective is attained in a method according to the invention.

The core of the present invention comprises providing a shell-structure in the target material prior to the molding process. This shell-structure is a hollow structure representing the matrix for molding the micro-structure to be produced, i.e. the target material is inserted into the shell structure for molding such that the shape of the hollow space is yielded located in and/or encased by the shell structure. The shell structure itself usually exhibits a relatively small volume itself with regards to the space enclosed thereby so that its production requires only little time. This is essentially different from a process in which a negative resists is exposed everywhere outside a source structure. Another advantage may for example be higher resolution or functionality, which also may reduce the writing time.

The implementation of this inventive principle occurs here in a first step via spatially resolved exposure of a source material, for example a negative resist, with subsequently the unexposed areas being removed therefrom.

In a first variant, which may be used when a negative resist is applied in a preferred embodiment, with a multi-photon exposure method being applied or the stereolithography or during laser sintering or the like, a three-dimensional source structure is written into the source material surrounding the form of the microstructure to be created as a matrix. This matrix then remains on the substrate, while the unexposed source material is removed. The source structure produced as the matrix can then be used as the shell structure according to the invention. If applicable, this shell structure must be opened prior to the removal of the unexposed source material so that the desired hollow structure and/or shell structure develops. In this variant of the method according to the invention the shell structure according to the invention is directly written into the source material so that an interim step for the production of a shell structure is unnecessary. As mentioned above, this can occur advantageously in a high-resolution negative resist, in which structures can be generated in the interesting range of height and/or distance from the substrate from approximately 0.1 µm to approximately 1 mm.

Another advantage of this variant of the method according to the invention comprises that the shell is not required to homogenously surround the later developing micro-hollow structure or in a surface-conforming manner. For example, this allows a targeted, guided motion (rotation or feed) of the filled micro-structure when the exterior surrounding the microstructure is filled with a different material and the shell is removed in a subsequent step, which opens decisive new possibilities for MEMS-applications.

In a second variant of the method according to the invention a source structure is written into the source material, which unlike the first variant does not describe the form to be produced as a template but which itself exhibits the form to be produced. The source structure can here completely fill the form of the microstructure to be produced; however it may be sufficient only to write the exterior contour of the shape of the microstructure to be produced into the source material as the source structure. Here, it is only important that the source structure is written into the source material, which remains after the removal of the unexposed source material and shows a closed exterior contour in the form of the microstructure to be produced.

Then a shell structure is generated around this remaining source structure as a supplementary structure, for example by way of coating, spraying, or vapor coating. If applicable, this shell structure must then be opened in order to allow access from the outside to the interior of the shell structure so that now the source structure can be removed. Subsequently the molding in the target material occurs by said material being inserted into the shell structure. Although this second variant requires one more processing step than the first variant, here the option is given though to use a variety of materials for the shell structure so that the shell structure can remain partially or entirely, after the actual microstructure has been produced. The shell structure can then accept a support function for the actual microstructure or, after the surrounding exterior space has been filled and the shell subsequently removed, allow certain motions of the microstructure.

If the shell structure must be opened to gain access to its interior within the scope of the invention this may occur mechanically, particularly by way of polishing, cutting, or the like, or via corroding methods, particularly using reactive ion etching or plasma etching.

The introduction of the target material into the shell structure preferably occurs by precipitation from a solution which generally occurs galvanically, however may also occur via electroless deposition/plating.

When molding the target material it is easily possible within the scope of the present invention to insert different target materials subsequently or simultaneously into the shell structure in order to provide the microstructure to be produced with the desired features. Preferably the target material comprises gold, silver, copper, nickel, tungsten, cobalt, and/or alloys of these metals as well as, for example, additional alloys, such as NiFe, NiCo, or SnPb, without being limited thereto.

The writing of the source structure into the source material occurs preferably by inserting a focused laser beam into the source material, as known per se (see e.g., S. Maruo, O. Nakamura, and S. Kawala, "Three-dimensional microfabrication with two-photon-absorbed photopolymerization," Opt. Lett. 22, 132 (1997)). Here, three-dimensional structures can be written with high precision.

In order to allow inserting the target material into the shell structure using a galvanic process it is beneficial to use a substrate with an electrically conductive surface. This may be an electrically conductive substrate, or a substrate provided with an electrically conductive coating. For example the transparent oxide ITO may be used, but the direct writing on conductive substrates such as silicon is possible as well. Here, it is advantageous when those areas of the substrate surface surrounding the shell structure are covered at the outside by an isolating layer so that in order to insert the target material into the shell structure only the areas of the substrate surface located inside the shell structure remain electrically conductive. This ensures that the target material is also precipitated only inside the shell structure. Due to the fact that the shell structure according to the invention projects relatively far beyond the surface of the substrate such an electrically conductive coating can easily occur by an isolating material laterally flowing in, for example a resist. However it is also possible to equip the surface of the substrate to be provided with an electric insulation or the like, using a laterally isolating layer, or depending on the geometry of the three-dimensional structure also directly from the top by way of vapor-coating, spraying, or otherwise in a targeted or undirected fashion. A chemical functionalization can further lead to the desired spatial selectivity of the growth process in case of electroless plating.

Alternatively, a pre-structured substrate, for example a circuit board, may be used as the substrate, i.e. the substrate itself comprises an electrically isolating material, with electrically conductive structures of this type being embedded in the substrate such that at each area at which an interior area of a shell structure shall develop an electrically conductive passage is prepared towards its interior.

BRIEF DESCRIPTION Of THE DRAWINGS

Several exemplary embodiments for applications of methods embodied according to the invention are described and explained in the following based on the attached drawings. Shown are.

DETAILED DESCRIPTION OF THE PREFERRED EMBODIMENTS

Figure 1:
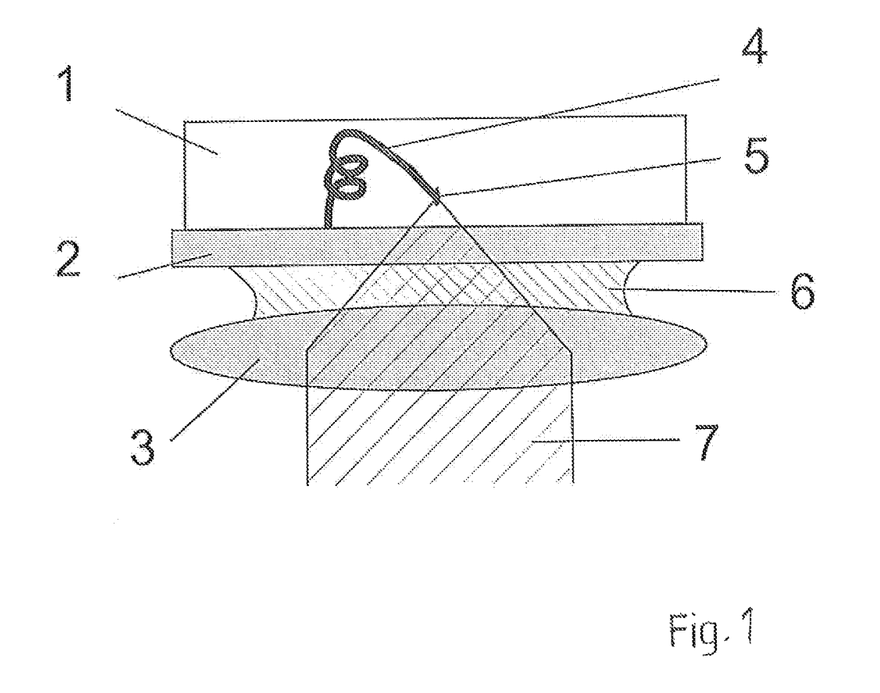
FIG. 1: a schematic illustration of a device by which some processing steps of the method according to the invention can be performed.

FIG. 1 shows schematically and as an example the method of writing a three-dimensional source structure into a source material via direct laser writing. A laser beam 7 is focused via a lens 3 and perhaps via an immersion medium 6 and through a transparent substrate 2 into a negative resist 1 as the source material 5. By this exposure the physical and/or chemical properties of the resist 4 change, in the example shown here they are polymerized. In the following wet-chemical development e.g., the entire source material can be removed, except for the polymerized resist 4.

Figure 2:
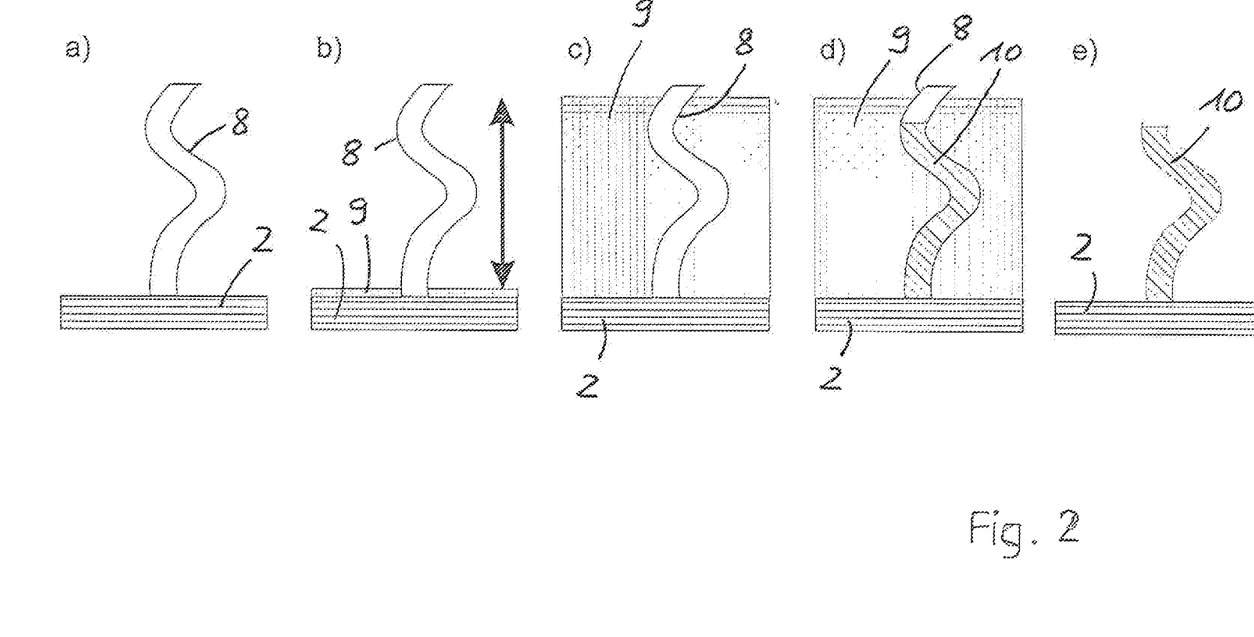
FIG. 2: a schematic illustration of the sequence of the most important processing steps in an exemplary implementation of the method according to the invention.

FIG. 2 shows schematically an example for an application of the method according to the invention. On a substrate 2, conductive per se or rendered conductive by way of coating, a three-dimensional structure 8 is written as a hollow structure (a). After developing the exterior area is electrically isolated by applying an isolator 9, for example by way of casting a liquid resist of an arbitrary height (b, c), with the height e.g., may later accept an (additional) supportive function. The hollow structure 8 can be filled (d) as needed with a target material 10 up to a certain height. In the following, the support 9 can be removed, for example, in order to release (e) the metallic structure 10 and/or the alloy.

Figure 3:
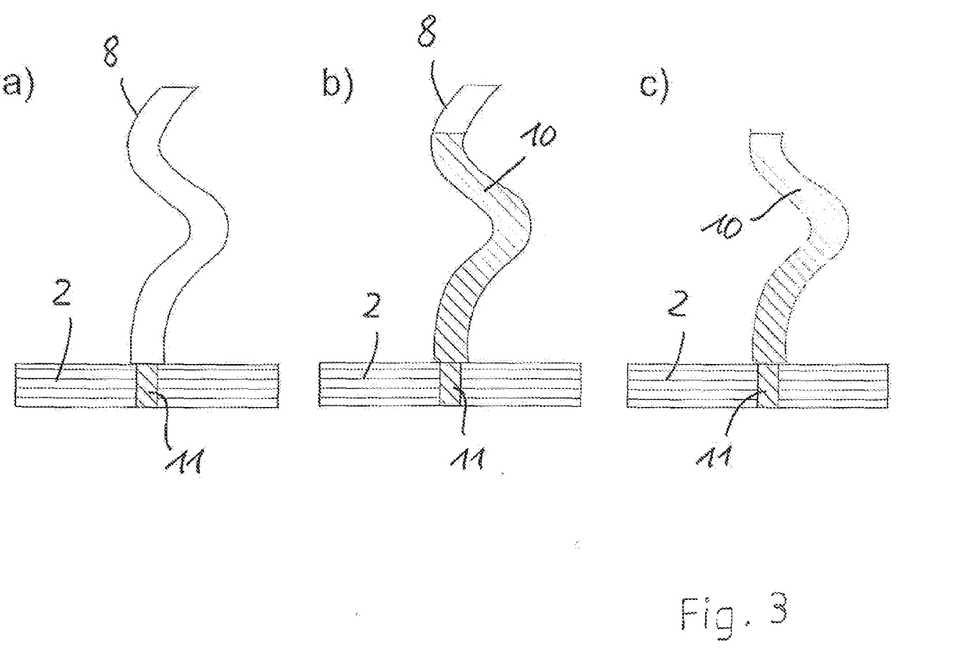
FIG. 3: a schematic illustration of the sequence of the most important processing steps in an exemplary implementation of the method according to the invention.

FIG. 3 shows schematically another exemplary embodiment, with writing and perhaps developing a three-dimensional hollow structure 8 (a), which is already positioned in reference to a pre-structured substrate 2 such that only the interior space is filled (b) in a subsequent galvanic or electroless growth process with the target material 10 up to the desired height. The substrate could for example represent an electrically contacted circuit board 11. Subsequently the supporting hollow structure 8 can be removed (c).

Figure 4:
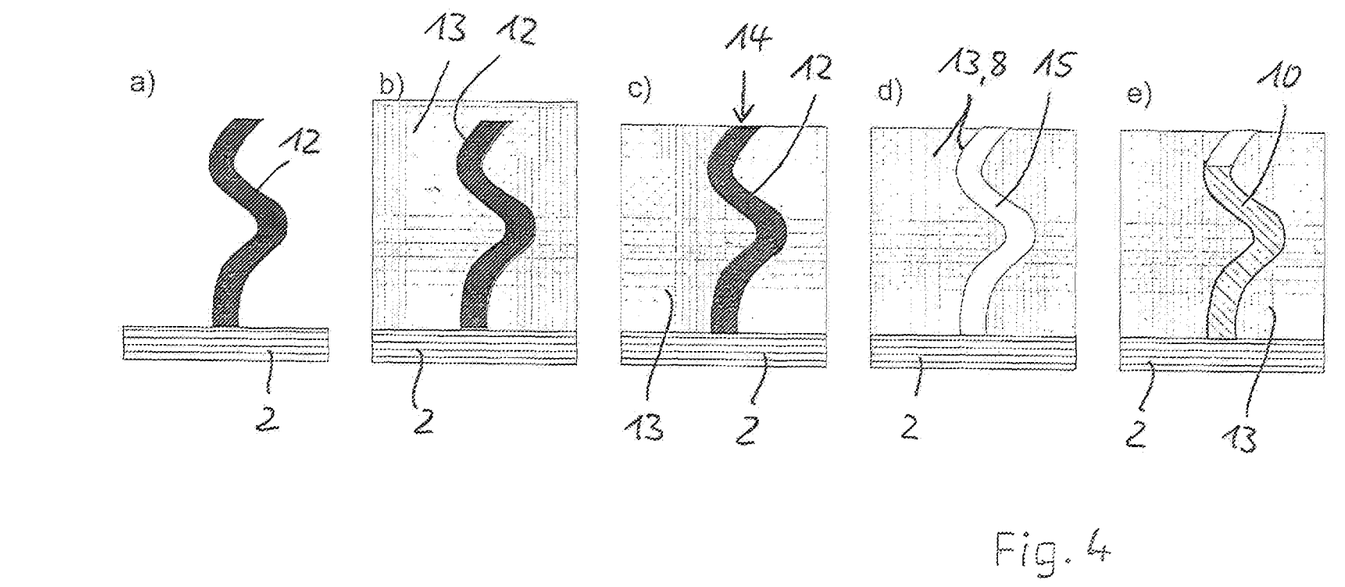
FIG. 4: a schematic illustration of the sequence of the most important processing steps in an exemplary implementation of the method according to the invention.

FIG. 4 shows schematically another exemplary embodiment with writing and perhaps developing a three-dimensional body with a closed surface as the source structure 12 (a). This may for example be surrounded (b) in a subsequent step partially or entirely with another auxiliary material 13. For this purpose, it may become necessary in a complete embedding to first release the surface 14 of the source material 12 by way of polishing, etching, or other methods in order to then completely remove (d) the source material 12 so that the auxiliary means 13 form the shell structure 9 according to the invention, and subsequently the target material 10 is inserted into the interior 15.

Figure 5:
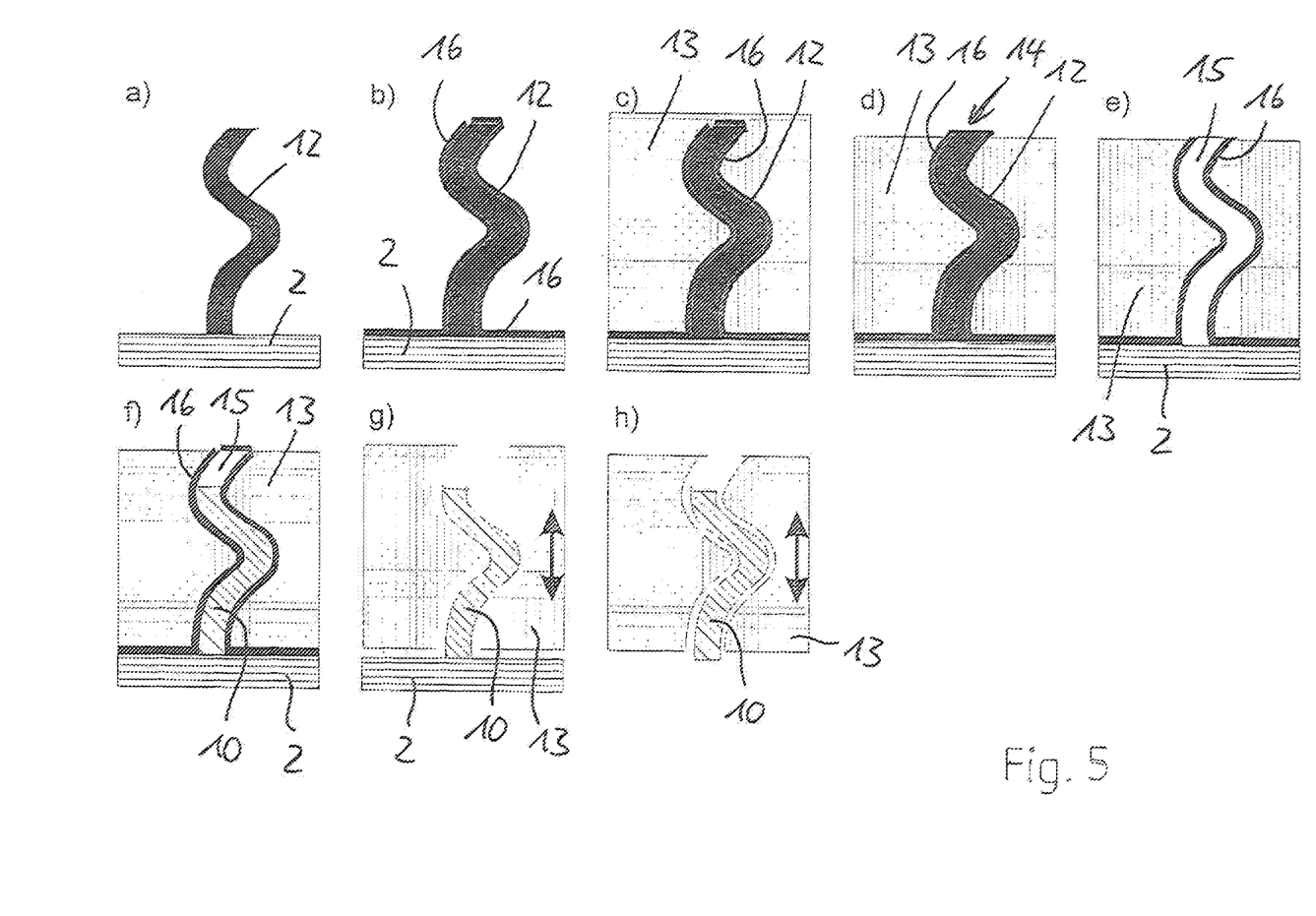
FIG. 5: a schematic illustration of the sequence of the most important processing steps in an exemplary implementation of the method according to the invention.

FIG. 5 shows schematically another exemplary embodiment with writing and perhaps developing a three-dimensional body (a) with a closed surface as the source structure 12. For example, by way of vapor-coating the surface can be coated (b) with a second auxiliary material 16, which ultimately allows mobility (g, h), after the performance of the steps (c-f) described concerning FIG. 4 and the removal thereof (g). The thickness of the material 16 here controls the range of motion.

Figure 6:
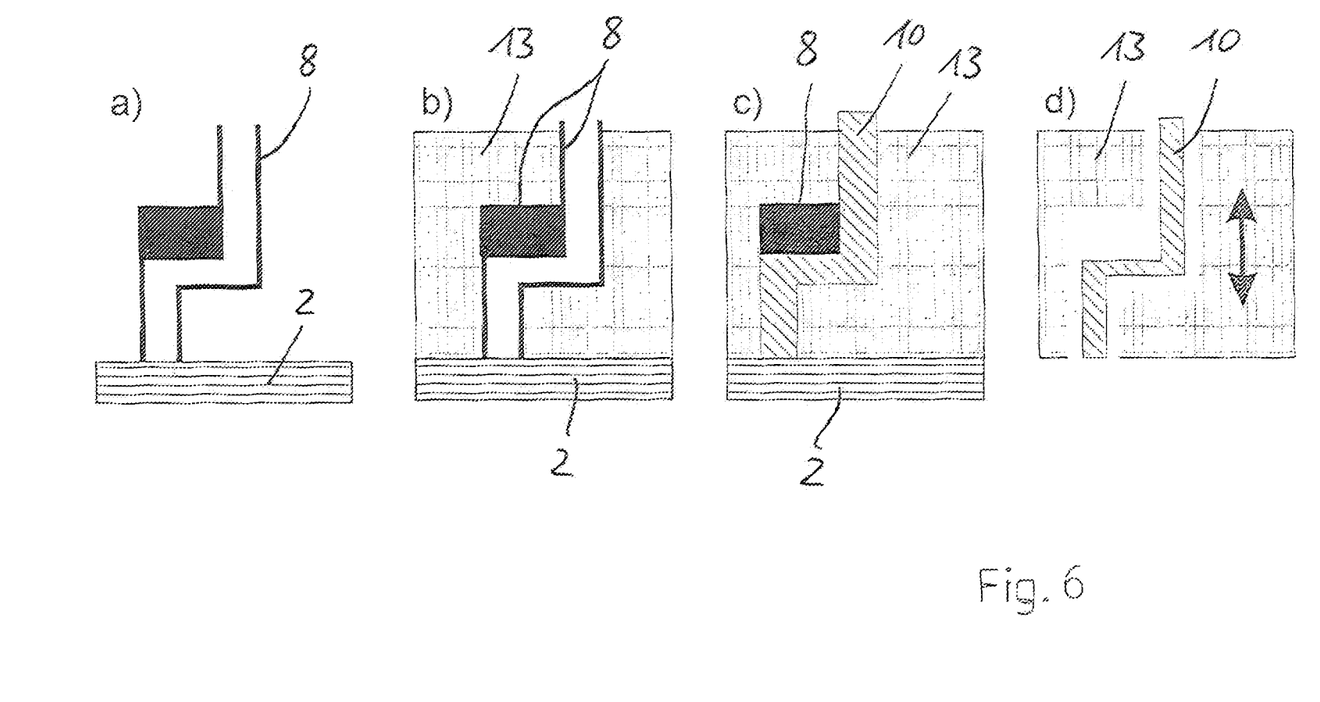
FIG. 6: a schematic illustration of the sequence of the most important processing steps in an exemplary implementation of the method according to the invention.

FIG. 6 shows schematically another exemplary embodiment with writing and perhaps developing a three-dimensional hollow body (a) as a shell structure 8, which is particularly characterized in the wall thickness is different, thus the exterior shell of the hollow body 8 is no longer surface-conforming in reference to the inside. This allows, after the progression of the above-described steps (b-d), targeted mobility (e.g., guided rotation or gliding along one or more directions), which particularly creates new options for MEMS-applications.

The invention claimed is:

1. A method for the production of three-dimensional microstructures, comprising the following steps:
    applying a source material (1) having a property that is changeable by exposure to electromagnetic radiation (7) onto a substrate (2),
    writing a three-dimensional source structure (4, 8, 12) into the source material (1) via a locally resolving exposure by inserting a focused laser beam (5) into the source material (1) to directly form the three-dimensional source structure,
    removing the source material (1) except for the three-dimensional source structure (4, 8, 12),
    molding a target material which the micro-structure (10) to be produced is made from using the source structure,
    providing a shell structure surrounding a form of a microstructure (10) to be produced, with the source structure (8, 12) being created as the shell structure or the shell structure being produced using the source structure (12), and
    inserting the target material into the shell structure.

2. A method according to claim 1, wherein the source structure (8) is written, which surrounds the form of the microstructure (10) to be produced as a matrix, and the source material (1) is removed except for the source structure (8) and the source structure (8) is used as a shell structure.

3. A method according to claim 1, wherein the source structure (12) is written with a closed exterior form, which essentially matches an exterior form of the microstructure (10) to be produced such that the source material (1) is removed except for the source structure (12) and the shell structure surrounding the source structure (12) is created by way of coating with an auxiliary material (13, 16), and subsequently the source structure (12) is removed.

4. A method according to claim 3, wherein the source structure (4, 8, 12) is created directly by laser writing, rapid prototyping, or stereo-lithography.

5. A method according to claim 3, wherein the shell structure is opened mechanically for removing the source structure (12), by way of polishing, cutting, or etching methods.

6. A method according to claim 1, wherein insertion of the target material into the shell structure occurs by way of precipitation from a solution or via electroless plating.

7. A method according to claim 1, wherein several different target materials are inserted into the shell structure subsequently or simultaneously.

8. A method according to claim 1, wherein Au, Ag, Cu, Ni, W, Co, or alloys of these metals or alloys of NiFe, NiCo, SnPb are used as target materials.

9. A method according to claim 1, wherein a resist or sinter material is used as the source material (1).

10. A method according to claim 1, wherein a substrate (2) is used with an electrically conductive surface.

11. A method according to claim 10, wherein prior to inserting the target material (10) into the shell structure, areas of an electrically conductive surface of the substrate (2) surrounding the shell structure are covered by an isolating layer (9).

12. A method according to claim 1, wherein a substrate (2) is used comprising an electrically isolating material with at least one electrically conductive passage (11) into an interior (15) of the shell structure.

13. A method according to claim 1, wherein the shell structure is removed after the insertion of the target material (10).

* * * * *